(12) United States Patent
Hynes (10) Patent No.: US 7,447,061 B1
(45) Date of Patent: Nov. 4, 2008

(54) MAGNETORESISTIVE MEMORY ARRAY CIRCUIT

(75) Inventor: Owen J. Hynes, Otsego, MN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/714,300

(22) Filed: Mar. 2, 2007

(51) Int. Cl.
*G11C 11/00* (2006.01)

(52) U.S. Cl. ........................ 365/158; 365/173

(58) Field of Classification Search ............... 365/158, 365/173
See application file for complete search history.

(56) References Cited

U.S. PATENT DOCUMENTS

| | | | |
|---|---|---|---|
| 5,541,868 A | 7/1996 | Prinz | 365/98 |
| 5,956,267 A | 9/1999 | Hurst et al. | 365/158 |
| 5,995,342 A * | 11/1999 | Cohen et al. | 360/125.35 |
| 6,163,477 A * | 12/2000 | Tran | 365/173 |
| 6,269,027 B1 | 7/2001 | Hurst et al. | 365/189.05 |
| 6,317,359 B1 | 11/2001 | Black et al. | 365/158 |
| 6,445,613 B1 | 9/2002 | Nagai | 365/171 |
| 6,462,981 B2 * | 10/2002 | Numata et al. | 365/158 |
| 6,542,000 B1 | 4/2003 | Black et al. | 326/39 |
| 6,744,662 B2 | 6/2004 | Freitag et al. | 365/158 |
| 6,882,566 B2 | 4/2005 | Nejad et al. | 365/173 |
| 2002/0180432 A1* | 12/2002 | Torok et al. | 324/252 |
| 2004/0075940 A1* | 4/2004 | Bajorek et al. | 360/110 |
| 2004/0174756 A1* | 9/2004 | Kunikiyo et al. | 365/200 |
| 2006/0002216 A1* | 1/2006 | Ooishi | 365/210 |
| 2007/0019466 A1* | 1/2007 | Suzuki et al. | 365/171 |

* cited by examiner

*Primary Examiner*—Michael T Tran
(74) *Attorney, Agent, or Firm*—John Tarlano (57) ABSTRACT

An MOS write transistor is connected to write coils of a magnetoresistive memory cell. The MOS write transistor controls passage of a write current into the write coils of the magnetoresistive memory cell. An array of MOS write transistors and an associated array of magnetoresistive memory cells are within a magnetoresistive memory array circuit.

4 Claims, 11 Drawing Sheets

MAGNETORESISTIVE MEMORY ARRAY CIRCUIT

In U.S. Pat. No. 6,744,662, a magnetoresistive memory array circuit uses column leads and row leads. Current is sent past several memory cells by a row lead. Current is also sent past several memory cells by a row lead. Magnetoresistive memory cells are exposed to a magnetic field coming from a current that passes through such a lead. Such magnetic exposure can effect magnetic polarizations of the memory cells.

In U.S. Pat. No. 6,882,566, conductive lines convey a current from an access transistor, past several magnetoresistive memory cells. Several magnetoresistive memory cells are exposed to a magnetic field from current passing through such lines Such magnetic exposure can effect magnetic polarizations of the memory cells.

The magnetoresistive memory array circuit of the present invention has a write transistor connected to each magnetoresistive memory cell. Each write transistor is used to convey a polarization current to only a single selected magnetoresistive memory cell of the magnetoresistive memory array circuit. Other magnetoresistive memory cells of the array circuit are not effected by a magnetic field that is generated by a polarization current that is passing to the selected magnetoresistive memory cell.

In the magnetoresistive memory array circuit of the present invention, each magnetoresistive memory cell has two magnetoresistive resistors and two electromagnetic coils. Each of the two magnetoresistive resistors of a memory cell is located within one of the two electromagnetic coils. The two electromagnetic coils are connected together to form a connected pair of electromagnetic coils.

A current conducting electrode of a single write transistor is connected, in series circuit, to a free end of the two connected electromagnetic coils of a pair of electromagnetic coils. The single write transistor is used to transmit a polarization current, that is, a write current through the connected pair of electromagnetic write coils of a magnetoresistive memory cell.

A single write transistor is connected to a connected pair of electromagnetic coils of each magnetoresistive memory cell of the memory array circuit. Each magnetoresistive memory cell-transistor combination has a pair of magnetoresistive resistors, a pair of electromagnetic coils and a write transistor.

Two magnetoresistive resistors, of each magnetoresistive memory cell, are usually adjacent to one another. Each magnetoresistive resistor, of the two magnetoresistive resistors of a memory cell, is located within one coil of the two electromagnetic coils of a pair of electromagnetic coils. The two electromagnetic coils are connected together. A single write transistor is connected, in series circuit, to the two electromagnetic coils.

The disclosed magnetoresistive memory array circuit uses a plurality of pairs of magnetoresistive resistors, a plural of pairs of electromagnetic coils, a drain electrode of a write transistor connected to each electromagnetic coil pair, a power supply and four power transistors. The two power transistors are connected to second current conducting electrodes of all of the write transistors of a memory array. Two other power transistors are connected to an opposite end of each electromagnetic coil pair of the memory array. A write-select line is connected to a gate of each write transistor.

Two of the four power transistors direct a current through selected electromagnetic coil pairs in a first direction, to write a zero bit in associated magnetoresistive resistors. Two other power transistors, of the four power transistors, direct a current in a direction opposite to the first direction, to write a one bit in associated magnetoresistive resistors.

Each electromagnetic coil pair is selectively powered by a single write transistor that is connected to the electromagnetic coil pair.

SUMMARY OF THE INVENTION

A write subcircuit for a magnetoresistive memory array comprising a plurality of magnetoresistive memory cells, each magnetoresistive memory cell containing a connected pair of electromagnetic write coils, the electromagnetic write coils of each connected pair of electromagnetic write coils being oppositely wound, each of the connected pairs of electromagnetic write coils having a first end and a second end, each second end connected to a first line and a plurality of MOS write transistors for writing binary bits into the plurality of magnetoresistive memory cells, each of the MOS write transistors having a first current conducting electrode and a second current conducting electrode and a gate electrode, each first current conducting electrode connected to a separate first end of a connected pair of electromagnetic write coils, each second current conducting electrode connected to a second line.

DESCRIPTION OF THE PREFERRED EMBODIMENT

Figure 1:
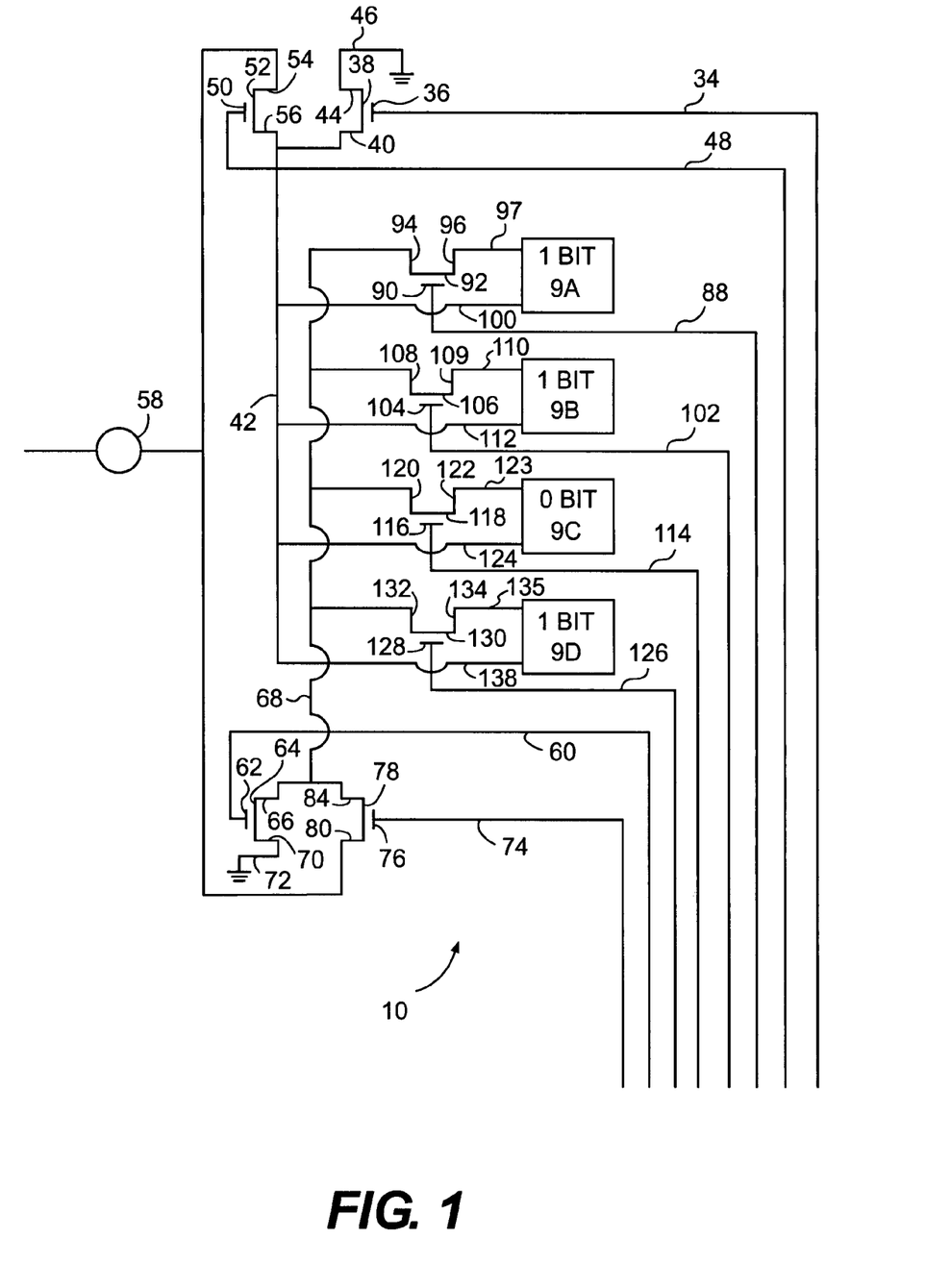
FIG. 1 is a schematic diagram of a write subcircuit for a magnetoresistive memory array circuit.
Figure 11:
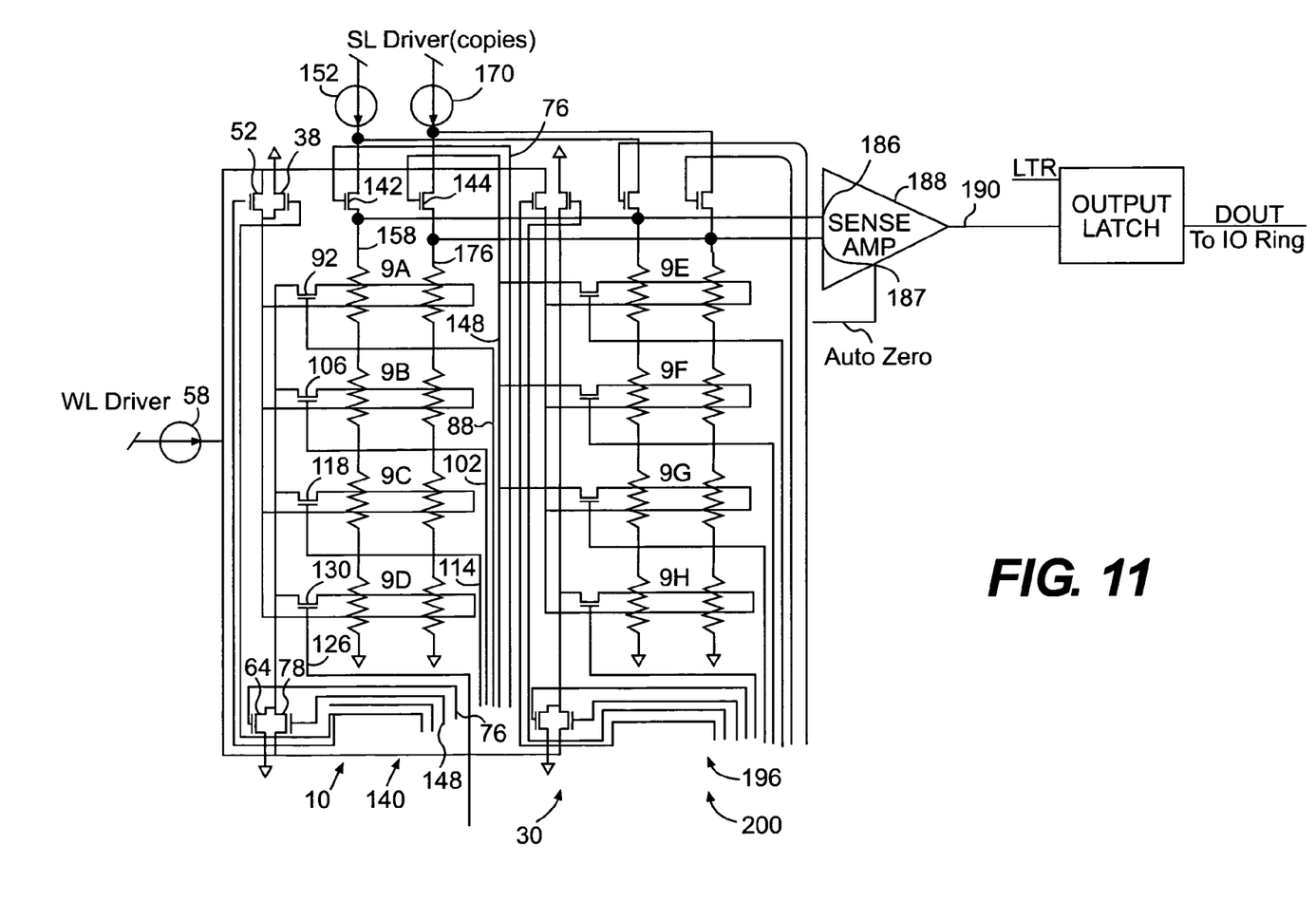
FIG. 11 is a schematic diagram of a magnetoresistive memory array circuit.

A write subcircuit 10, that is part of a magnetoresistive memory array circuit 30 of FIG. 11, is shown in FIG. 1. The write subcircuit 10 has magnetoresistive memory cells 9A, 9B, 9C and 9D. Memory cells 9A, 9B and 9D have a one bit stored in each of them. Memory cell 9C has a zero bit stored in it.

Figure 2:
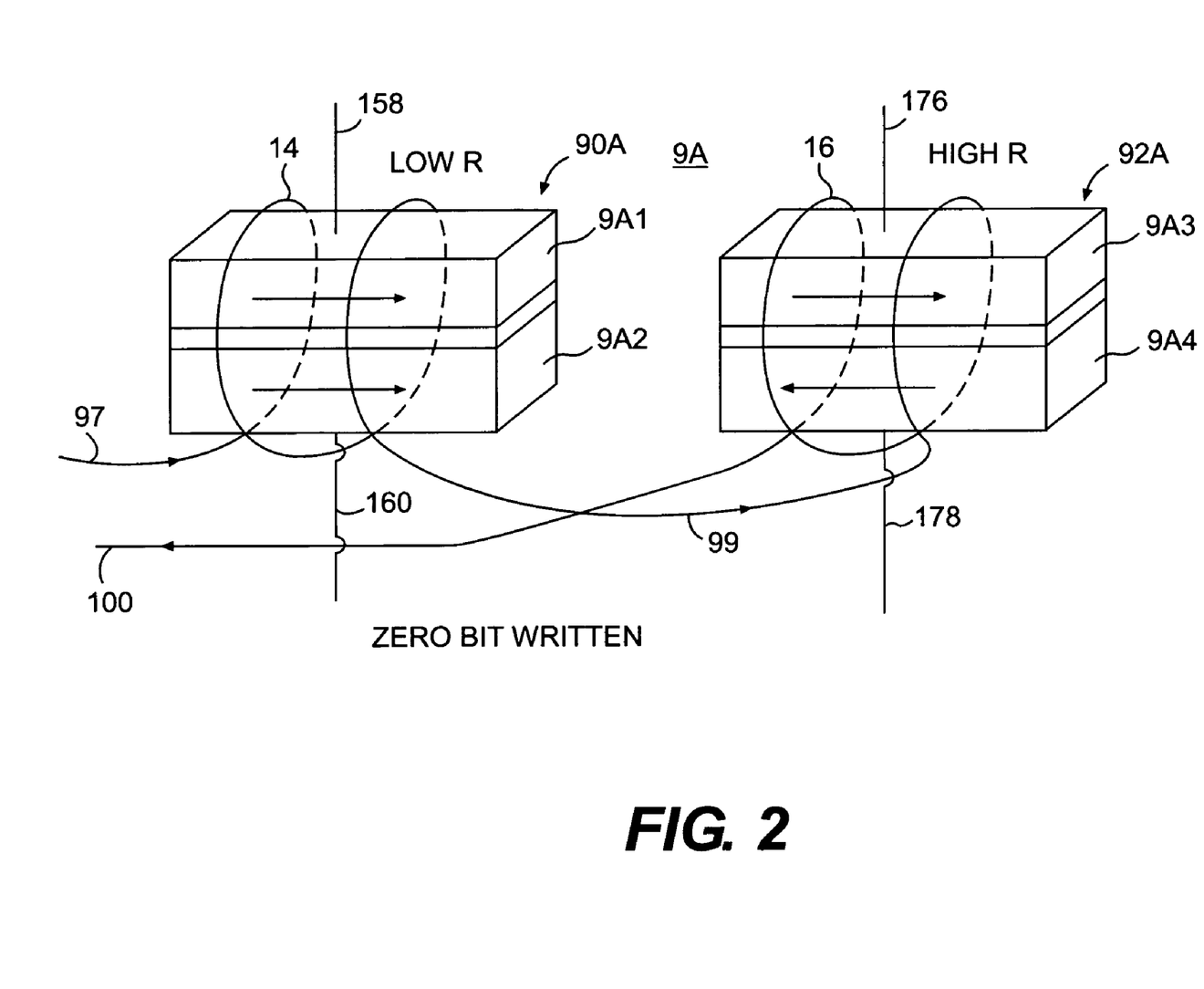
FIG. 2 is a perspective view of a magnetoresistive memory cell 9A that holds a 0 bit.

An end 97, of electromagnetic coils 14 and 16 of magnetoresistive memory cell 9A of FIG. 2, is connected to first current conducting electrode 96 of MOS write transistor 92, within write subcircuit 10. An end 100 of electromagnetic write coils 16 and 18 of memory cell 9A is connected to first line 42. Second current conducting electrode 94 of MOS write transistor 92 is connected to second line 68.

Figure 4:
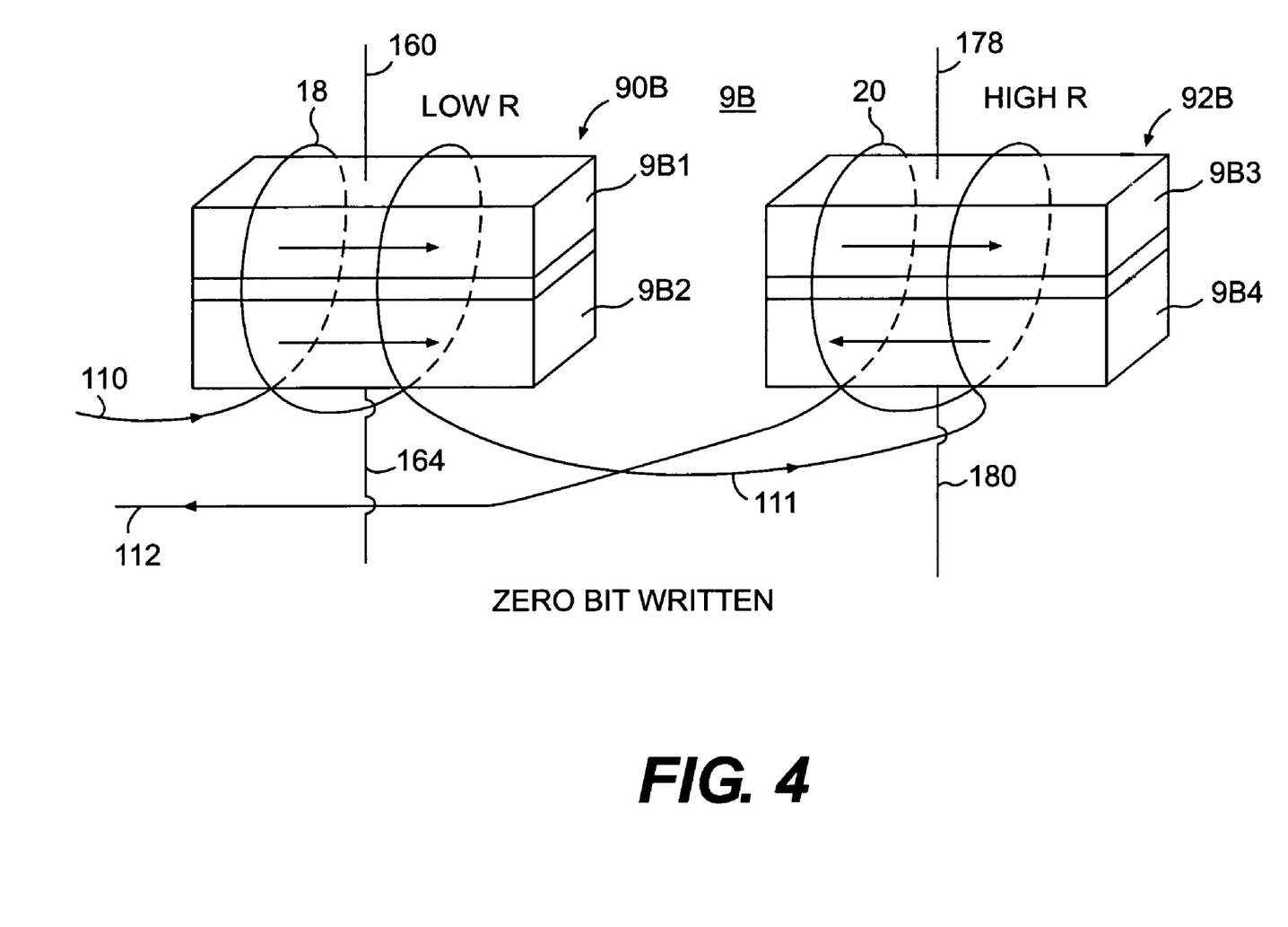
FIG. 4 is a perspective view of a magnetoresistive memory cell 9B that holds a 0 bit.

An end 110, of electromagnetic coils 18 and 20 of magnetoresistive memory cell 9B of FIG. 4, is connected to first current conducting electrode 109 of MOS write transistor 106, within write subcircuit 10. An end 112 of electromagnetic write coils 18 and 20 of memory cell 9B is connected to first line 42. Second current conducting electrode 108 of MOS write transistor 106 is connected to second line 68.

Figure 6:
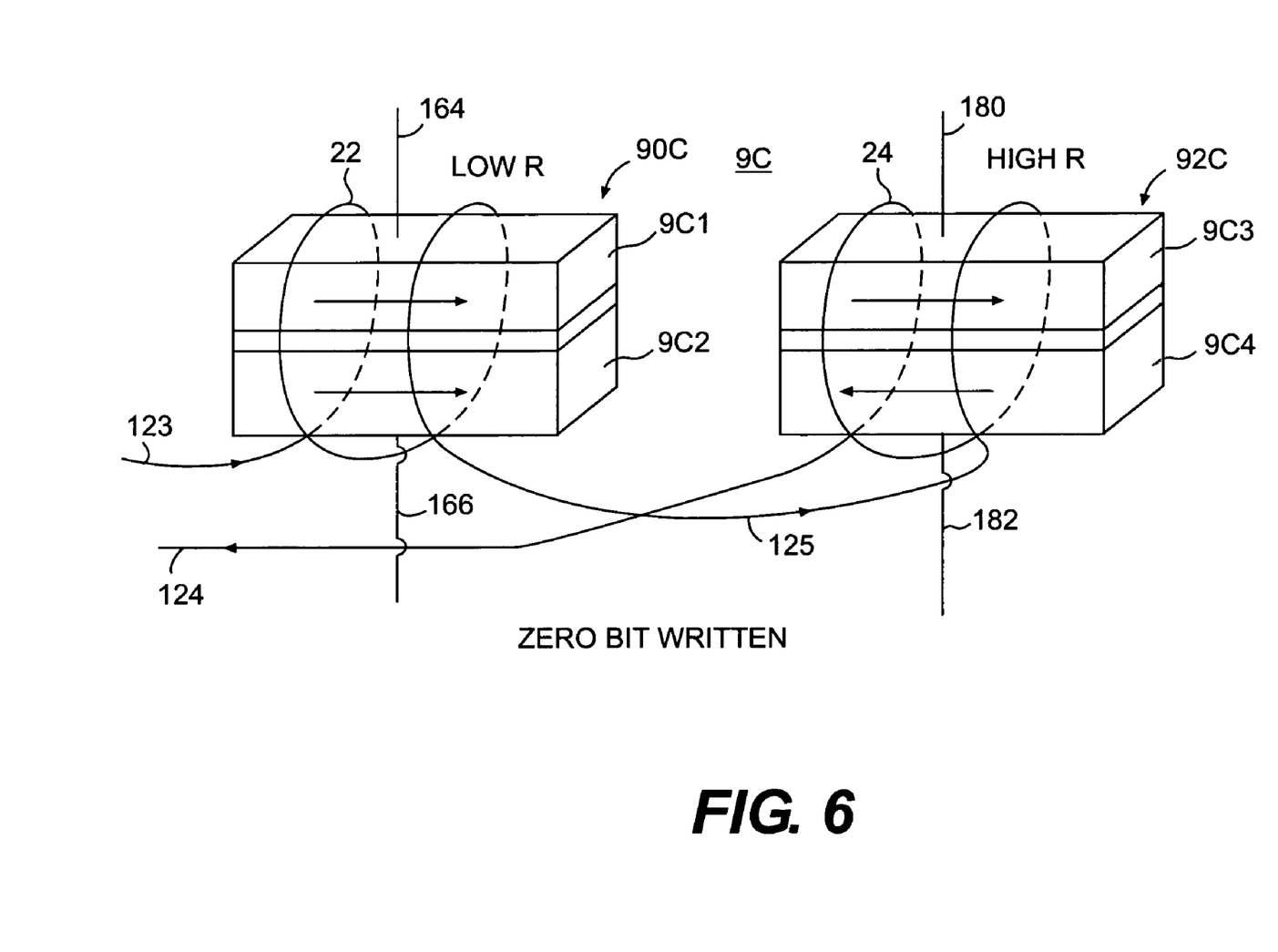
FIG. 6 is a perspective view of a magnetoresistive memory cell 9C that holds a 0 bit.

An end 123, of electromagnetic coils 22 and 24 of magnetoresistive memory cell 9C of FIG. 6, is connected to first current conducting electrode 122 of MOS write transistor 118, within write subcircuit 10. An end 124 of electromagnetic write coils 22 and 24 of memory cell 9C is connected to first line 42. Second current conducting electrode 120 of MOS write transistor 118 is connected to second line 68.

Figure 8:
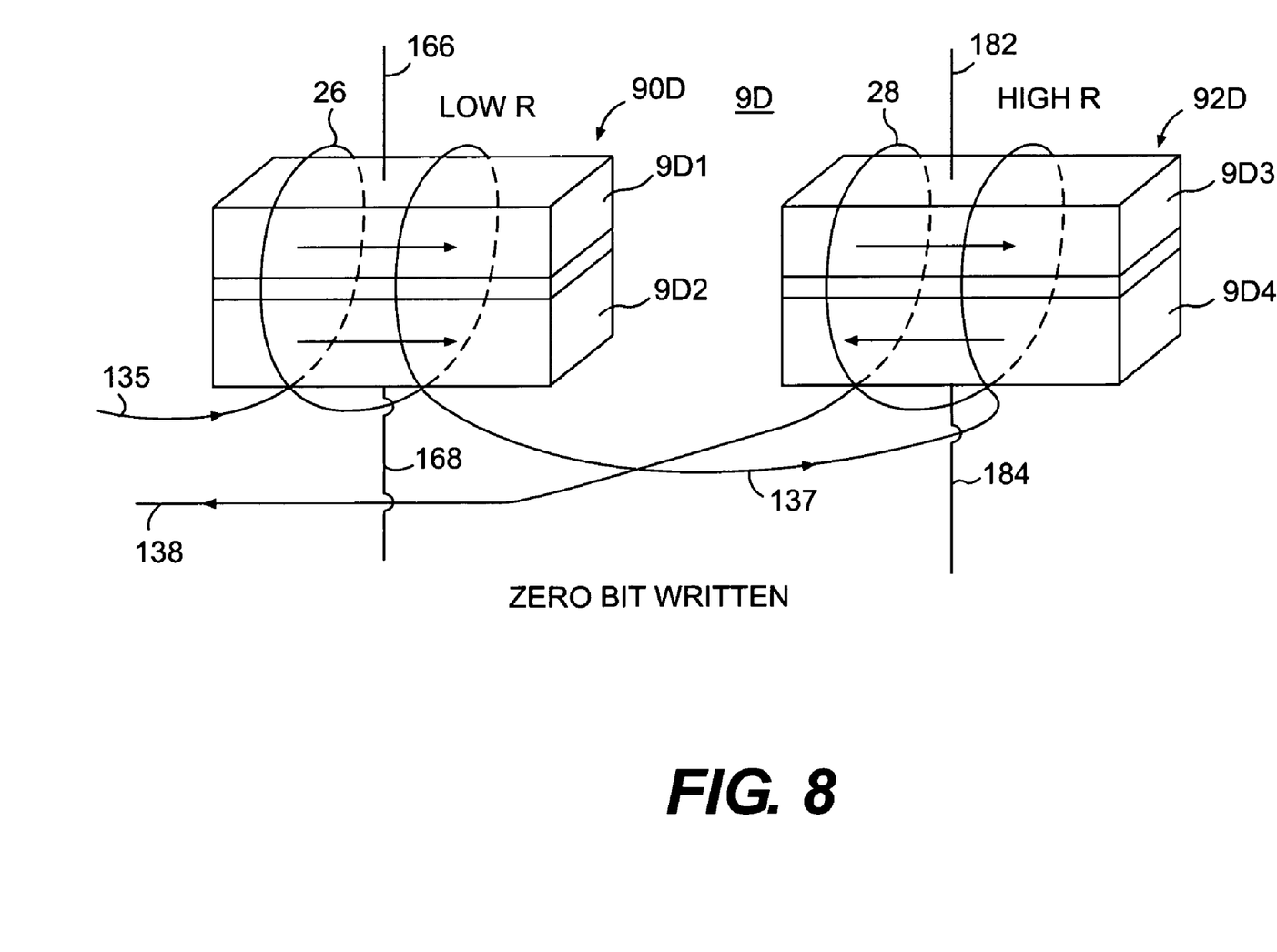
FIG. 8 is a perspective view of a magnetoresistive memory cell 9D that holds a 0 bit.

An end 135, of electromagnetic coils 26 and 28 of magnetoresistive memory cell 9D of FIG. 8, is connected to first current conducting electrode 134 of MOS write transistor 130, within write subcircuit 10. An end 138 of electromagnetic write coils 26 and 28 of memory cell 9D is connected to first line 42. Second current conducting electrode 132 of MOS write transistor 130 is connected to second line 68.

In FIG. 1, a first power-select line 34 is connected to a gate electrode 36 of a grounding transistor 38. A source electrode 40 of transistor 38 is connected to line 42. A drain electrode 44 of grounding transistor 38 is connected to ground by a line 46.

A second power-select line 48 is connected to a gate electrode 50 of a power transistor 52. A source electrode 54 of power transistor 52 is connected to power supply 58. A drain electrode 56 of power transistor 52 is connected to line 42.

A third power-select line 60 is connected to a gate electrode 62 of a grounding transistor 64. A source electrode 66 of grounding transistor 64 is connected to line 68. A drain electrode 70 of grounding transistor 64 is connected to ground by a line 72.

A fourth power-select line 74 is connected to a gate electrode 76 of a power transistor 78. A source electrode 80 of the power transistor 78 is connected to power supply 58. A drain electrode 84 of power transistor 78 is connected to line 68.

A first write-select line 88 is connected to a gate electrode 90 of MOS write transistor 92. A second current conducting electrode 94 of write transistor 92 is connected to line 68. A first current conducting electrode 96 of write transistor 92 is connected to an end 97 of electromagnetic write coils 14 and 16 of memory cell 9A.

A second write-select line 102 is connected to a gate electrode 104 of MOS write transistor 106. A second current conducting electrode 108 of write transistor 106 is connected to line 68. A first current conducting electrode 109 of write transistor 106 is connected to an end 110 of electromagnetic write coils 18 and 20 of memory cell 9B.

A third write-select line 114 is connected to a gate electrode 116 of MOS write transistor 118. A second current conducting electrode 120 of write transistor 118 is connected to line 68. A first current conducting electrode 122 of write transistor 118 is connected to an end 123 of electromagnetic write coils 22 and 24 of memory cell 9C.

A fourth write-select line 126 is connected to a gate electrode 128 of MOS write transistor 130. A second current conducting electrode 132 of write transistor 130 is connected to line 68. A first current conducting electrode 134 of write transistor 130 is connected to an end 135 of electromagnetic write coils 26 and 28 of memory cell 9D.

Figure 3:
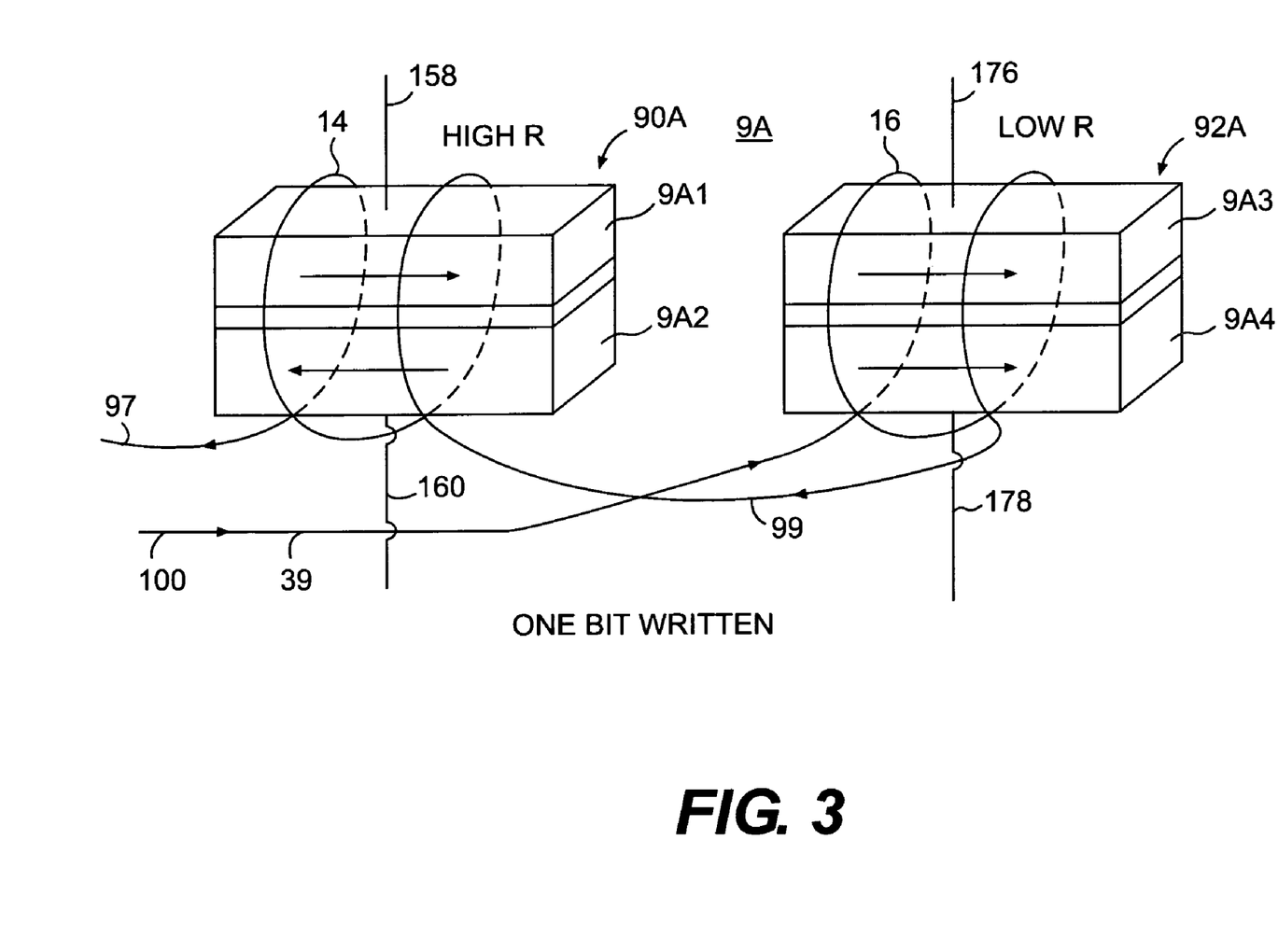
FIG. 3 is a perspective view of a magnetoresistive memory cell 9A that holds a 1 bit.

A zero bit is written into the memory cell 9A by energizing lines 34, 74 and 88 of FIG. 1. A one bit is then written into memory cell 9A by energizing lines 48, 60 and 88 of FIG. 1. In FIG. 3, a one bit is shown as located in memory cell 9A.

Figure 5:
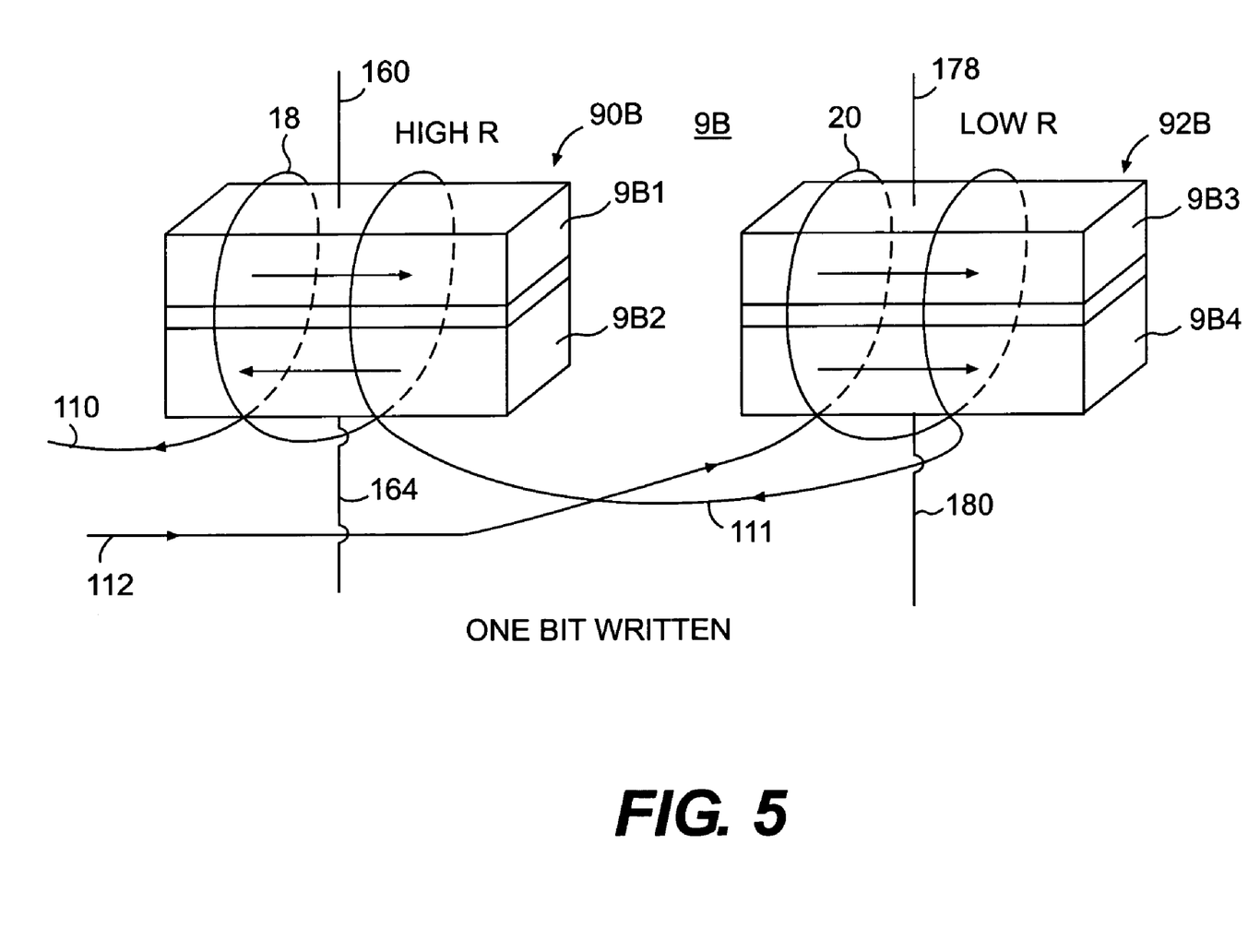
FIG. 5 is a perspective view of a magnetoresistive memory cell 9B that holds a 1 bit.

A zero bit is written into the memory cell 9B by energizing lines 34, 74 and 102 of FIG. 1. A one bit is then written into memory cell 9B by energizing lines 48, 60 and 102 of FIG. 1. In FIG. 5, a one bit is shown as located in memory cell 9B.

A one bit is written into memory cell 9C by energizing lines 48, 60 and 114 of FIG. 1. A zero bit is then written into memory cell 9C by energizing lines 34, 74 and 114 of FIG. 1. In FIG. 6, a zero bit is shown as located in memory cell 9C.

Figure 9:
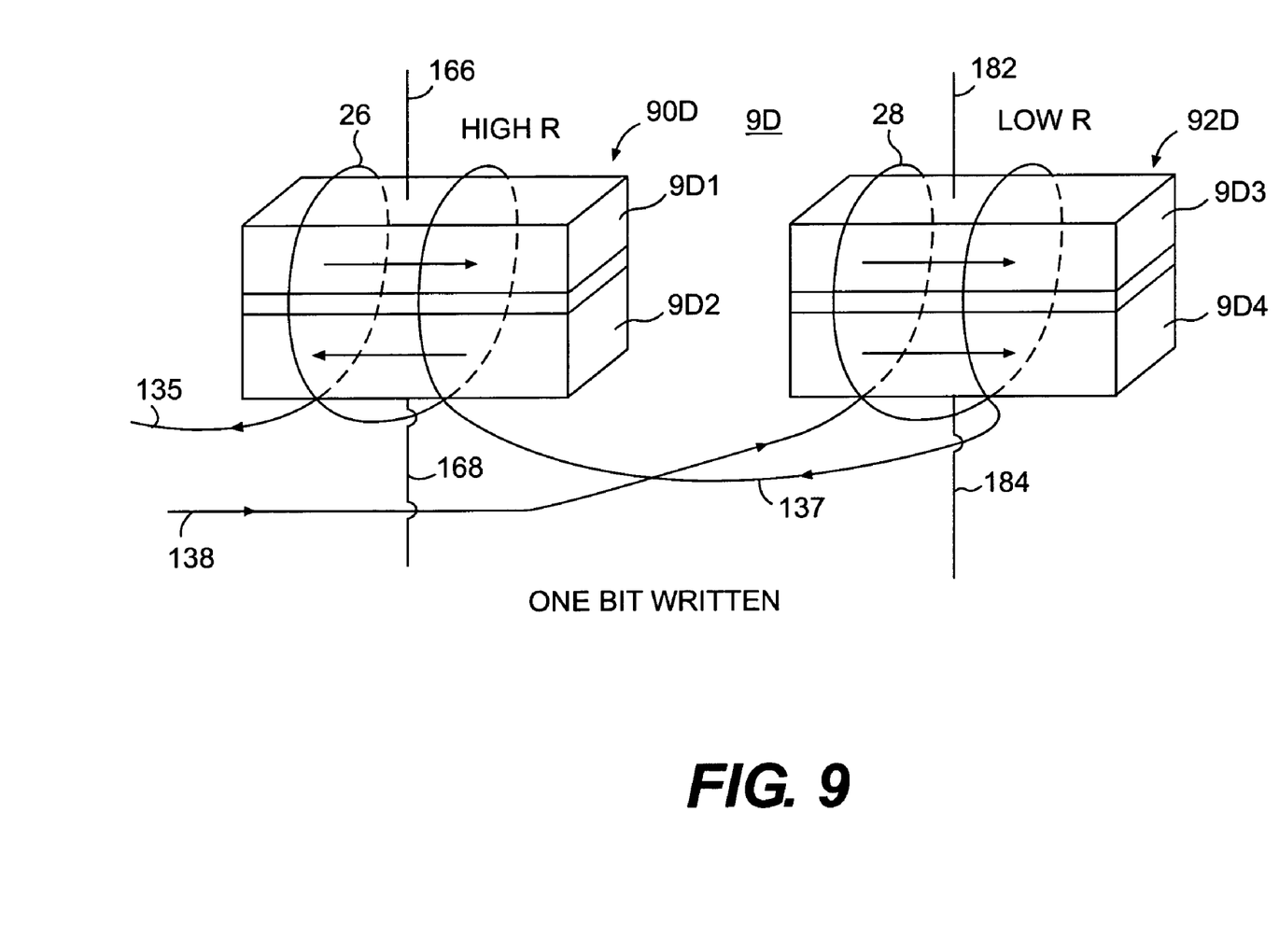
FIG. 9 is a perspective view of a magnetoresistive memory cell 9D that holds a 1 bit.

A zero bit is written into memory cell 9D by energizing lines 34, 74, and 126 of FIG. 1. A one bit is then written into memory cell 9C by energizing lines 48, 60 and 126, of FIG. 1. In FIG. 9, a one bit is shown as located in memory cell 9D.

As shown in FIGS. 2 and 3, connected electromagnetic coils 14 and 16 are located in magnetoresistive memory cell 9A. The coil 14 is wrapped counterclockwise around resistor layers 9A1 and 9A2, and continuing coil 16 is wrapped clockwise around resistor layers 9A3 and 9A4. The connected coil 16 has a section 99.

As shown in FIGS. 4 and 5, connected electromagnetic coils 18 and 20 are located in magnetoresistive memory cell 9B. The coil 18 is wrapped counterclockwise around resistor layers 9B1 and 9B2, and continuing coil 20 is wrapped clockwise around resistor layers 9A3 and 9A4. The connected coil 20 has a section 111.

Figure 7:
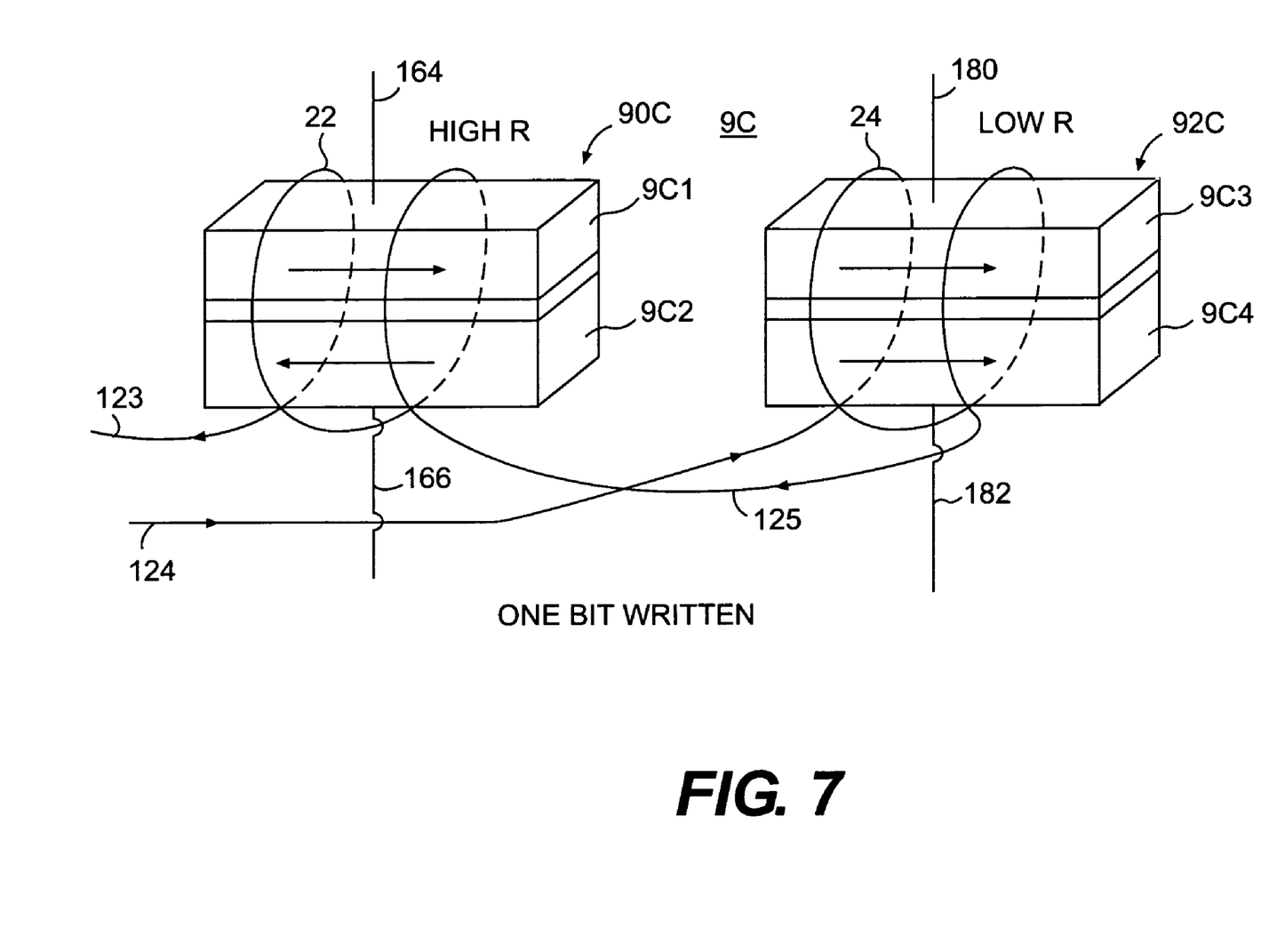
FIG. 7 is a perspective view of a magnetoresistive memory cell 9C that holds a 1 bit.

As shown in FIGS. 6 and 7, connected electromagnetic coils 22 and 24 are located in magnetoresistive memory cell 9C. The coil 22 is wrapped counterclockwise around resistor layers 9C1 and 9C2, and continuing coil 24 is wrapped clockwise around resistor layers 9C3 and 9C4. The connected coil 24 has a section 125.

As shown in FIGS. 8 and 9, connected electromagnetic coils 26 and 28 are located in magnetoresistive memory cell 9D. The coil 26 is wrapped counterclockwise around resistor layers 9D1 and 9D2, and continuing coil 28 is wrapped clockwise around resistor layers 9D3 and 9D4. The connected coil 28 has a section 137.

In FIG. 2 memory cell 9A hold a 0 bit. Resistor 90A, of magnetoresistive memory cell 9A, has resistance layer 9A1 and 9A2. Layer 9A1 is permanently polarized in a right pointing direction, that is, pinned. Layer 9A2 can be polarized in a right pointing or left pointing direction, depending on the direction that current flows through coil 14. Since current flows into end 97 of coil 14, layer 9A2 is polarized in a right pointing direction.

In FIG. 2, resistor 92A, of magnetoresistive memory cell 9A, has resistance layers 9A3 and 9A4. Layer 9A3 is permanently polarized in a right pointing direction, that is, pinned. Layer 9A4 can be polarized in a right pointing or left pointing direction, depending on the direction that current flows through coil 16. Since current flows into section 99 of coil 16, layer 9A4 is polarized in a left pointing direction.

In FIG. 3, memory cell 9A holds a 1 bit. Since current flows into end 100 of coil 16, layer 9A4 is polarized in a right pointing direction. Since current flows out of section 99 of coil 16, layer 9A2 is polarized in a left pointing direction.

In FIG. 4 memory cell 9B holds a 0 bit. Resistor 90B, of magnetoresistive memory cell 9B, has resistance layer 9B1 and 9B2. Layer 9B1 is permanently polarized in a right pointing direction, that is, pinned. Layer 9B2 can be polarized in a right pointing or left pointing direction depending on the direction that current flows through coil 18. Since current flows into end 110 of coil 18, layer 9B2 is polarized in a right pointing direction.

In FIG. 4 resistor 92B, of magnetoresistive memory cell 9B, has resistance layers 9B3 and 9B4. Layer 9B3 is permanently polarized in a right pointing direction, that is, pinned. Layer 9B4 can be polarized in a right pointing or left pointing direction depending on the direction that current flows through coil 20. Since current flows into section 111 of coil 20, layer 9B4 is polarized in a left pointing direction.

In FIG. 5 memory cell 9B holds a 1 bit. Since current flows into end 112 of coil 20, layer 9B4 is polarized in a right pointing direction. Since current flows out of section 111 of coil 20, layer 9B2 is polarized in a left pointing direction.

In FIG. 6 memory cell 9C holds a 0 bit. Resistor 90C, of magnetoresistive memory cell 9C, has resistance layer 9C1 and 9C2. Layer 9C1 is permanently polarized in a right pointing direction, that is, pinned. Layer 9C2 can be polarized in a right pointing or left pointing direction depending on the direction that current flows through coil 22. Since current flows into end 123 of coil 22, layer 9C2 is polarized in a right pointing direction.

In FIG. 6 resistor 92C, of magnetoresistive memory cell 9C, has resistance layers 9C3 and 9C4. Layer 9C3 is permanently polarized in a right pointing direction, that is, pinned. Layer 9C4 can be polarized in a right pointing or left pointing direction depending on the direction that current flows through coil 24. Since current flows into section 125 of coil 24, layer 9C4 is polarized in a left pointing direction.

In FIG. 7 memory cell 9C holds a 1 bit. Since current flows into end 124 of coil 24, layer 9C4 is polarized in a right pointing direction. Since current flows out of section 125 of coil 24, layer 9C2 is polarized in a left pointing direction.

In FIG. 8 memory cell 9D holds a 0 bit. Resistor 90D, of magnetoresistive memory cell 9D, has resistance layer 9D1 and 9D2. Layer 9D1 is permanently polarized in a right pointing direction, that is, pinned. Layer 9D2 can be polarized in a right pointing or left pointing direction depending on the direction that current flows through coil 26. Since current flows into end 135 of coil 26, layer 9D2 is polarized in a right pointing direction.

In FIG. 8 resistor 92D, of magnetoresistive memory cell 9D, has resistance layers 9D3 and 9D4. Layer 9D3 is permanently polarized in a right pointing direction, that is, pinned. Layer 9D4 can be polarized in a right pointing or left pointing direction depending on the direction that current flows through coil 28. Since current flows into section 137 of coil 28, layer 9D4 is polarized in a left pointing direction.

In FIG. 9 memory cell 9D holds a 1 bit. Since current flows out of section 137 of coil 28, layer 9D2 is polarized in a left pointing direction. Since current flows into end 138 of coil 28, layer 9D4 is polarized in a right pointing direction.

In FIG. 2 resistor 92A has a higher resistance than resistor 90A. In FIG. 3 resistor 92A has a lower resistance than resistance 90A. In FIG. 4 resistor 92B has a higher resistance than resistor 90B. In FIG. 5 resistor 92B has a lower resistance than resistor 90B. In FIG. 6 resistor 92C has a higher resistance than resistor 90C. In FIG. 7 resistor 92C has a lower resistance than resistor 90C. In FIG. 8 resistor 92D has a higher resistance than resistor 90D. In FIG. 9 resistor 92D has a lower resistance than resistor 90D.

Figure 10:
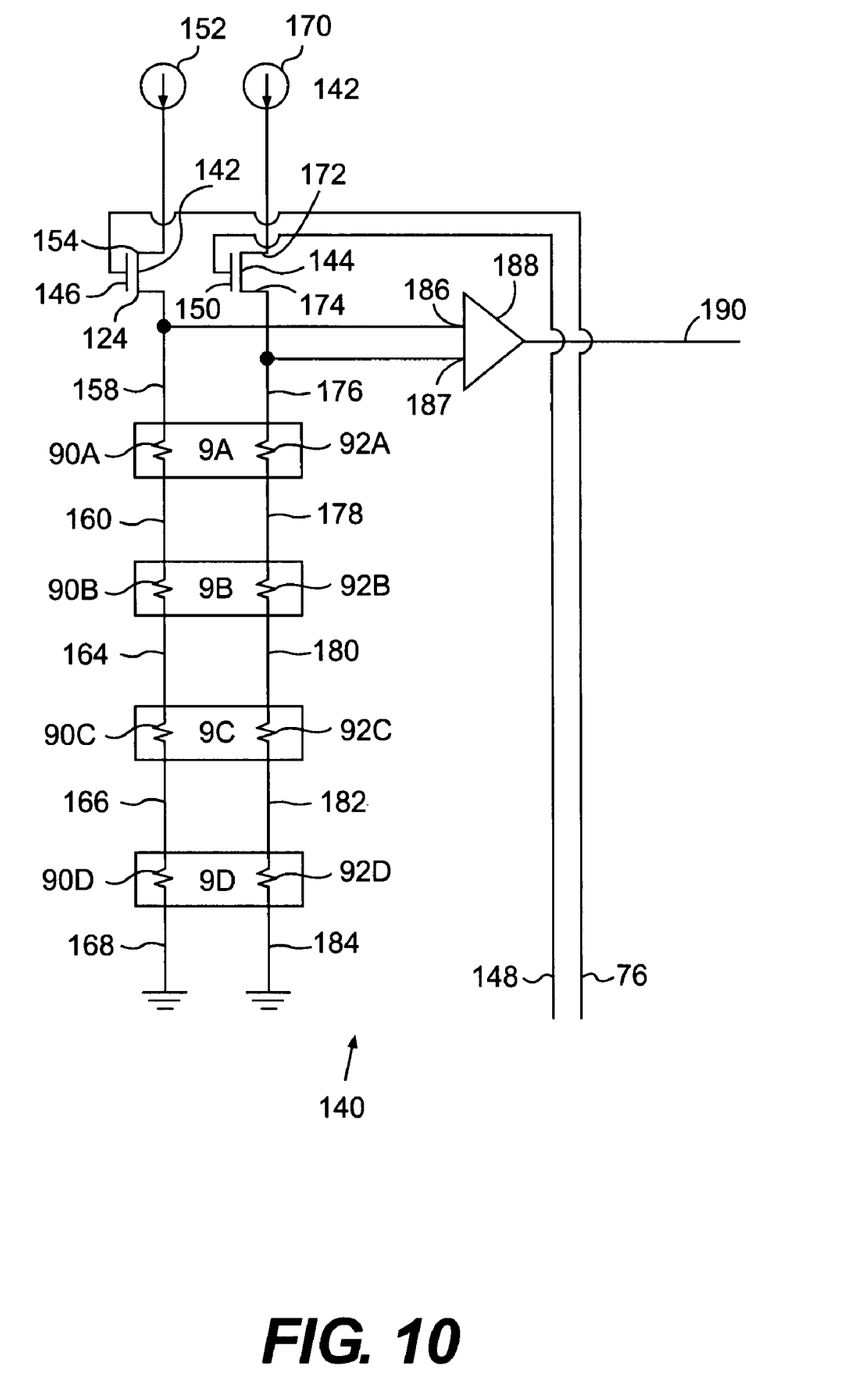
FIG. 10 is a schematic diagram of a read subcircuit for a magnetoresistive memory array.

FIG. 10 shows a read subcircuit 140 for memory cells 9A, 9B, 9C and 9D of FIG. 1. The read subcircuit 140 has read transistors 142 and 144. A read line 76 is connected to a gate 146 of read transistor 142. A read line 148 is connected to a gate 150 of read transistor 144.

A power source 152 is connected to source electrode 154 of read transistor 142. Drain electrode 124 of transistor 142 is connected to line 158. Line 158 is connected to magnetoresistive resistor 90A. Lines 160, 164, and 166 connect magnetoresistive resistors 90A, 90B, 90C and 90D in series circuit. Line 168 grounds the magnetoresistive resistor 90D.

A power source 170 is connected to source electrode 172 of read transistor 144. Drain electrode 174 of transistor 144 is connected to line 176. Line 176 is connected to magnetoresistive resistor 92A. Lines 178, 180, and 182 connect magnetoresistive resistors 92A, 92B, 92C and 92D in series circuit. Line 184 grounds the magnetoresistive resistor 92D.

One input 186 of a differential amplifier 188 is connected to readout line 158. A second input 190 of differential amplifier 188 is connected to readout line 176.

In FIG. 10, in order to read a bit value of a binary one bit, that has been stored in memory cell 9A, transistors 142 and 144 are turned on. The output of current sense differential amplifier 188 on line 190 is read. Transistors 142 and 144 are turned off. A one bit is written into memory cell 9A by the write subcircuit 10 of FIG. 1. The output of current sense differential amplifier 188 is determined after again turning on read transistors 142 and 144. The output from current sense differential amplifier 188 is read out from line 190. The value of the output of current sense differential amplifier 188 on line 190 is determined to be unchanged. The output of differential amplifier is determined to be the same as it was before the one bit was written into memory cell 9A. Therefore it is determined that a one bit was stored in memory cell 9A. Transistors 142 and 144 are turned off.

The current sense differential amplifier 188 is a binary output differential amplifier. The current sense differential amplifier 188 can determine the current difference in total current through the resistors on lines 158, 160, 164, 166 and 168, and total current through resistors on lines 176, 178, 180, 182 and 184. The difference in resistance between the magnetoresistive resistors in each of memory cells 9A, 9B, 9C and 9D can be detected by the current sense differential amplifier 188.

Again, a one bit was written into memory cell 9A during a probe of the bit value in memory cell A. A lack of change in output of differential amplifier 188 indicates that there was no change in the differential resistance between resistors 90A and 92A during the probe of memory cell 9A. This lack of change in the output level indicates that a one bit was initially stored in memory cell 9A.

A one bit is written into memory cell 9B and the output level of current sense differential amplifier 188 is determined not to change from before the write of a one bit into memory cell 9B. This lack of change indicates that a one bit was initially stored in memory cell 9B.

A one bit is written into memory cell 9C and the output level of current sense differential amplifier 188 is determined to change from before the write of a one bit into memory cell 9C. This change indicates that a zero bit was initially stored in memory cell 9C. A zero bit is then written into memory cell 9C.

A one bit is written into memory cell 9D and the output level of current sense differential amplifier 188 are determined not to change from an output level before the write of a one bit into memory cell 9D. This lack of change indicates that a one bit was initially stored in memory cell 9D.

In FIG. 11 magnetoresistive memory array circuit 30 is shown. The magnetoresistive memory array circuit 30 includes the write subcircuit 10 of FIG. 1 and the read subcircuit 140 of FIG. 10. The magnetoresistive memory array circuit 30 incorporates memory cells 9A to 9H. The write subcircuits of magnetoresistive memory array circuit 30 are write subcircuit 10 of FIG. 1 plus a write subcircuit 196. Write subcircuit 196 is essentially the same as write subcircuit 10. The read subcircuits are read subcircuit 140 of FIG. 10 plus a read subcircuit 200. Read subcircuit 200 is essentially the same as read subcircuit 140. The write and read lines, shown in FIGS. 1 and 10, are also shown in FIG. 11. The transistors, shown in FIGS. 1 and 10, are also shown in FIG. 11.

While the present invention has been disclosed in connection with the preferred embodiment thereof, it should be understood that there are other embodiments which fall within the spirit and scope of the invention as defined by the following claims.

What is claimed is:

1. A magnetoresistive memory array circuit, comprising:
(a) a plurality of magnetoresistive memory cells, each magnetoresistive memory cell containing a connected pair of electromagnetic write coils, the electromagnetic write coils of each connected pair of electromagnetic write coils being oppositely wound, each of the connected pairs of electromagnetic write coils having a first end and a second end, each second end connected to a first line; and
(b) a plurality of MOS write transistors for writing binary bits into the plurality of magnetoresistive memory cells, each of the MOS write transistors having a first current conducting electrode and a second current conducting electrode and a gate electrode, each first current conducting electrode connected to a separate first end of a connected pair of electromagnetic write coils, each second current conducting electrode connected to a second line.

2. A magnetoresistive memory array circuit, comprising:
(a) a plurality of magnetoresistive memory cells, each magnetoresistive memory cell containing a connected pair of electromagnetic write coils, the electromagnetic write coils of each connected pair of electromagnetic write coils being oppositely wound, each of the connected pairs of electromagnetic write coils having a first end and a second end, each second end connected to a first line;
(b) a plurality of MOS write transistors for writing binary bits into the plurality of magnetoresistive memory cells, each of the MOS write transistors having a first current conducting electrode and a second current conducting electrode and a gate electrode, each first current conducting electrode connected to a separate first end of a connected pair of electromagnetic write coils, each second current conducting electrode connected to a second line; and
(c) a write-select line connected to each gate electrode.

3. A magnetoresistive memory array circuit, comprising:
(a) a plurality of magnetoresistive memory cells, each magnetoresistive memory cell containing a connected pair of electromagnetic write coils, the electromagnetic write coils of each connected pair of electromagnetic write coils being oppositely wound, each of the connected pairs of electromagnetic write coils having a first end and a second end, each second end connected to a first line;
(b) a plurality of MOS write transistors for writing binary bits into the plurality of magnetoresistive memory cells, each of the MOS write transistors having a first current conducting electrode and a second current conducting electrode and a gate electrode, each first current conducting electrode connected to a separate first end of a connected pair of electromagnetic write coils, each second current conducting electrode connected to a second line;
(c) a write-select line connected to each gate electrode; and
(d) means for sending a current between the first line and the second line.

4. A magnetoresistive memory array circuit, comprising:
(a) a plurality of magnetoresistive memory cells, each magnetoresistive memory cell containing a connected pair of electromagnetic write coils, the electromagnetic write coils of each connected pair of electromagnetic write coils being oppositely wound, each of the connected pairs of electromagnetic write coils having a first end and a second end, each second end connected to a first line; and
(b) a plurality of MOS write transistors for writing binary bits into the plurality of magnetoresistive memory cells, each of the MOS write transistors having a first current conducting electrode and a second current conducting electrode and a gate electrode, each first current conducting electrode connected to a separate first end of a connected pair of electromagnetic write coils, each second current conducting electrode connected to a second line;
(c) a power supply; and
(d) two sets of power-supply transistors, each set having first and second power-supply transistors, a drain electrode of a first power-supply transistor of a first set connected to a second current conducting electrode of each memory transistor, a source electrode of a second power-supply transistor of the first set connected to a second end of each of the two connected electromagnetic write coils, a drain electrode of a first power-supply transistor of a second set connected to a second end of each of the two connected electromagnetic write coils, a source electrode of a second power-supply transistor of the second set connected to a second current conducting electrode of each memory transistor, the power supply connected to a source electrode of the first power-supply transistor of each set, a drain electrode of the second power-supply transistor of each set connected to ground.

* * * * *